(12) United States Patent
Kim et al.

(10) Patent No.: US 10,939,542 B2
(45) Date of Patent: Mar. 2, 2021

(54) PARTIALLY MOLDED SUBSTRATE AND PARTIAL MOLDING DEVICE AND METHOD

(71) Applicant: LG Chem, Ltd., Seoul (KR)

(72) Inventors: Jeong Wan Kim, Daejeon (KR); Hyunki Cho, Daejeon (KR)

(73) Assignee: LG Chem, Ltd.

( * ) Notice: Subject to any disclaimer, the term of this patent is extended or adjusted under 35 U.S.C. 154(b) by 0 days.

(21) Appl. No.: 16/581,866

(22) Filed: Sep. 25, 2019

(65) Prior Publication Data

US 2020/0022254 A1 Jan. 16, 2020

Related U.S. Application Data

(63) Continuation of application No. PCT/KR2018/002129, filed on Feb. 21, 2018.

(30) Foreign Application Priority Data

Jun. 15, 2017 (KR) .......................... 10-2017-0075870

(51) Int. Cl.
*B29C 37/00* (2006.01)
*B29C 70/68* (2006.01)
(Continued)

(52) U.S. Cl.
CPC ........... *H05K 1/0256* (2013.01); *B29C 37/00* (2013.01); *B29C 70/681* (2013.01); *B29C 70/74* (2013.01);
(Continued)

(58) Field of Classification Search
CPC ....... B29C 37/00; B29C 70/681; B29C 70/74; B29C 70/882; B29C 70/68; B29C 70/88;
(Continued)

(56) References Cited

U.S. PATENT DOCUMENTS 3,964,845 A * 6/1976 Duggan ............ B29C 45/14639
425/13
5,160,374 A 11/1992 Frederickson et al.
(Continued)

FOREIGN PATENT DOCUMENTS

JP 08331727 A * 12/1996 ............... H02G 1/14
JP H10209338 A 8/1998
(Continued)

OTHER PUBLICATIONS

Supplementary European Search Report including the Written Opinion for Application No. EP 18818161.4 dated Feb. 21, 2020, 10 pages.
(Continued)

*Primary Examiner* — Timothy J Thompson
*Assistant Examiner* — Guillermo J Egoavil
(74) *Attorney, Agent, or Firm* — Lerner, David, Littenberg, Krumholz & Mentlik, LLP

(57) ABSTRACT

A partially molded substrate and a partial molding apparatus and a method thereof, which cover and mold each of one or more conductors formed on the substrate with the insulator to prevent the sizes of the substrate from being increased due to molding, thereby efficiently preventing high voltage between the conductors on the substrate from being applied, and thereby preventing interference around the conductor.

9 Claims, 3 Drawing Sheets

(51) Int. Cl.
  *B29C 70/74* (2006.01)
  *B29C 70/88* (2006.01)
  *H05K 1/02* (2006.01)
  *H05K 3/00* (2006.01)
  *H05K 3/28* (2006.01)
  *B29L 31/34* (2006.01)

(52) U.S. Cl.
  CPC ......... *B29C 70/882* (2013.01); *H05K 1/0216* (2013.01); *H05K 3/0091* (2013.01); *H05K 3/28* (2013.01); *B29C 2037/90* (2013.01); *B29L 2031/3425* (2013.01); *H05K 2203/1327* (2013.01); *H05K 2203/163* (2013.01)

(58) Field of Classification Search
  CPC ........ B29C 2037/90; B29L 2031/3425; H05K 1/0216; H05K 1/0256; H05K 1/02; H05K 3/0091; H05K 3/28; H05K 3/285; H05K 3/00; H05K 2201/0162; H05K 2201/0989; H05K 2203/1327; H05K 2203/163
  USPC ........................................................ 174/250
  See application file for complete search history.

(56) References Cited

U.S. PATENT DOCUMENTS

| | | | |
|---|---|---|---|
| 5,450,286 A | 9/1995 | Jacques et al. | |
| 6,380,493 B1 | 4/2002 | Morita et al. | |
| 8,426,962 B2 | 4/2013 | Sasaki et al. | |
| 8,558,359 B2 | 10/2013 | Lim et al. | |
| 2008/0220549 A1 | 9/2008 | Nall et al. | |
| 2009/0053850 A1 | 2/2009 | Nishida et al. | |
| 2011/0111264 A1 | 5/2011 | Hanazono | |
| 2011/0260945 A1 | 10/2011 | Karasawa | |
| 2012/0149243 A1* | 6/2012 | Ohnishi | H01R 43/24 439/626 |
| 2014/0001613 A1 | 1/2014 | Ha | |
| 2015/0138740 A1 | 5/2015 | Shin et al. | |
| 2015/0235931 A1 | 8/2015 | Muto et al. | |
| 2015/0279547 A1 | 10/2015 | Park et al. | |
| 2019/0188445 A1* | 6/2019 | Chi | H01H 13/14 |

FOREIGN PATENT DOCUMENTS

| | | | | |
|---|---|---|---|---|
| JP | 2000-188298 A | 7/2000 | | |
| JP | 2008159744 A | 7/2008 | | |
| JP | 200951876 A | 3/2009 | | |
| KR | 100860528 B1 * | 9/2008 | ............ | H01H 33/00 |
| KR | 2013-0046487 A | 5/2013 | | |
| KR | 10-1388815 B1 | 4/2014 | | |
| KR | 2015-0073620 A | 7/2015 | | |
| KR | 2015-0114372 A | 10/2015 | | |
| WO | 2009026284 A2 | 2/2009 | | |

OTHER PUBLICATIONS

International Search Report dated May 28, 2018 in PCT/KR2018/002129, 2 pages.

* cited by examiner

PARTIALLY MOLDED SUBSTRATE AND PARTIAL MOLDING DEVICE AND METHOD

CROSS-REFERENCE TO RELATED APPLICATIONS

The present application is a continuation of International Application No. PCT/KR2018/002129 filed Feb. 21, 2018, which claims priority from Korean Patent Application No. 10-2017-0075870 filed in the Korean Intellectual Property Office on Jun. 15, 2017, all of which are incorporated herein by reference.

TECHNICAL FIELD

The present invention relates to a partially molded substrate and a partial molding apparatus and a method thereof, and more particularly, to a partially molded substrate and a partial molding apparatus and a method thereof, which cover and mold each of one or more conductors formed on a substrate with an insulator to prevent a size of the substrate from being increased due to molding, efficiently prevent high voltage from being applied between the conductors on the substrate, and prevent interference around the conductor.

BACKGROUND ART

In general, when a printed circuit board (PCB) substrate is designed, in order to prevent voltage interference between conductors on a substrate, the PCB substrate needs to be designed by maintaining an isolation distance including a clearance distance and a creepage distance between the conductors.

In the related art, since voltage applied between the conductors on the PCB substrate is low voltage, it is considered that it is not comparatively important to secure the isolation distance between the conductors, but in recent years, in the case of the PCB substrate, mounted on an electric vehicle, or the like, high voltage between the conductors on the PCB substrate is applied, and as a result, it is considered that it is important to secure the isolation distance between the conductors.

Meanwhile, in order to prevent the voltage interference between the conductors to which the high voltage is applied, when the isolation distance between the conductors is widened, the size of the PCB substrate is increased, and as a result, a problem in that there is a limit in installing the PCB substrate in an electric device.

For example, in the case of a recently developed and used battery pack, since an installation space of the PCB substrate for installing battery management systems (BMS) in the battery pack is limited, increasing the size of the PCB substrate due to securing the isolation distance causes substantial use of the PCB substrate to be restricted.

Meanwhile, in recent years, a method of molding the PCB substrate with an insulator is used in order to solve such a problem and effectively prevent the voltage between the conductors on the PCB substrate from being applied.

However, in the case of such a method, since all parts on the PCB substrate are buried in a molding due to molding, there is a problem that it is difficult to maintain and repair the parts on the PCB substrate.

In addition, since the PCB substrate is entirely molded with the insulator, a number of parts where the insulator is used inefficiently are generated, thereby causing a problem of inefficiently increasing molding cost of the PCB substrate.

In addition, since the PCB substrate is entirely molded, there has been a problem that the size and thickness of the PCB substrate are unnecessarily increased.

SUMMARY OF THE INVENTION

Technical Problem

An object of the present invention is to provide a partially molded substrate and a partial molding apparatus and a method thereof, which cover and mold each of one or more conductors formed on a substrate with an insulator to prevent the size of the substrate from being unnecessarily increased due to molding.

Further, an object of the present invention is to provide a partially molded substrate and a partial molding apparatus and a method thereof, which cover and mold each of one or more conductors formed on a substrate with the insulator to efficiently prevent voltage between the conductors on the substrate from being applied, and prevent interference around the conductor.

Further, an object of the present invention is to provide a partially molded substrate and a partial molding apparatus and a method thereof, which mold each of one or more conductors formed on a substrate to prevent a part on a PCB substrate including the conductor from being unnecessarily buried in the molding.

In addition, an object of the present invention is to provide a partially molded substrate and a partial molding apparatus and a method thereof, which selectively mold any one or more conductors which need to be molded among one or more conductors formed on a substrate to efficiently use the insulator.

Further, an object of the present invention is to provide a partially molded substrate and a partial molding apparatus and a method thereof, which efficiently use the insulator by selectively molding one or more conductors formed on a substrate to reduce design cost of the PCB substrate.

Moreover, an object of the present invention is to provide a partially molded substrate and a partial molding apparatus and a method thereof, which selectively mold one or more conductors formed on a substrate by setting a molding thickness of an insulator to prevent a thickness of the PCB substrate from being unnecessarily increased due to the molding.

Technical Solution

A partially molded substrate according to an embodiment of the present invention may include one or more conductors formed on one surface, and each of one or more conductors may be covered and molded with an insulator.

In an embodiment, in the partially molded substrate, the protruding conductor may be covered and molded with an insulation cap formed by the insulator.

In an embodiment, in the partially molded substrate, the conductor may be covered and molded with the insulator having a predetermined thickness.

In an embodiment, in the partially molded substrate, the conductor positioned in a predetermined molding region may be covered and molded with the insulator.

In an embodiment, in the partially molded substrate, the conductor to which voltage equal to or higher than predetermined voltage is applied among one or more conductors is applied may be covered and molded with the insulator.

A partial molding apparatus according to an embodiment of the present invention may include: a substrate; one or more conductors formed on one surface of the substrate; a sensing unit sensing one or more conductors; and a molding unit covering and molding each of one or more conductors sensed by the sensing unit with the insulator.

In an embodiment, when the conductor protrudes, the molding unit may cover and mold the protruding conductor with an insulation cap formed by the insulator.

In an embodiment, when a molding thickness is set, the molding unit may cover and mold the conductor with the insulator in the set thickness.

In an embodiment, when a molding region is set, the molding unit may cover and mold the conductor positioned in the set molding region with the insulator.

In an embodiment, the sensing unit may sense voltage applied from the conductor.

In an embodiment, the molding unit may cover and mold the conductor to which voltage equal to or higher than predetermined voltage is applied among one or more conductors sensed by the sensing unit with the insulator.

A partial molding method according to an embodiment of the present invention may include: filling an insulator; sensing one or more conductors formed on one surface of a substrate; and covering and molding each of one or more sensed with the insulator.

In an embodiment, in the molding, when the conductor protrudes, the protruding conductor may be covered and molded with an insulation cap formed by the insulator.

In an embodiment, in the molding, when a molding thickness is set, the conductor may be covered and molded with the insulator in the set thickness.

In an embodiment, in the molding, when a molding region is set, the conductor positioned in the set molding region may be covered and molded with the insulator.

In an embodiment, in the sensing, the voltage applied from the conductor may be sensed.

In an embodiment, in the molding, the conductor to which voltage equal to or higher than predetermined voltage is applied among one or more sensed conductors may be covered and molded with the insulator.

Advantageous Effects

According to an aspect of the present invention, provided are a partially molded substrate and a partial molding apparatus and a method thereof, which cover and mold each of one or more conductors formed on a substrate with an insulator to prevent the size of the substrate from being unnecessarily increased due to molding.

Further, according to another aspect of the present invention, provided are a partially molded substrate and a partial molding apparatus and a method thereof, which cover and mold each of one or more conductors formed on the substrate with the insulator to efficiently prevent voltage between the conductors on the substrate from being applied, and prevent interference around the conductor.

In addition, according to yet another aspect of the present invention, provided are a partially molded substrate and a partial molding apparatus and a method thereof, which mold each of one or more conductors formed on the substrate to prevent a part on a PCB substrate including the conductor from being unnecessarily buried in the molding.

Further, according to still yet another aspect of the present invention, provided are a partially molded substrate and a partial molding apparatus and a method thereof, which selectively mold one or more conductors which need to be molded among one or more conductors formed on the substrate to efficiently use the insulator.

Moreover, according to still yet another aspect of the present invention, provided are a partially molded substrate and a partial molding apparatus and a method thereof, which efficiently use the insulator by selectively molding one or more conductors formed on the substrate to reduce design cost of the PCB substrate.

In addition, according to still yet another aspect of the present invention, provided are a partially molded substrate and a partial molding apparatus and a method thereof, which selectively mold one or more conductors formed on the substrate by setting a molding thickness of the insulator to prevent a thickness of the PCB substrate from being unnecessarily increased due to the molding.

DETAILED DESCRIPTION

Figure 1A:
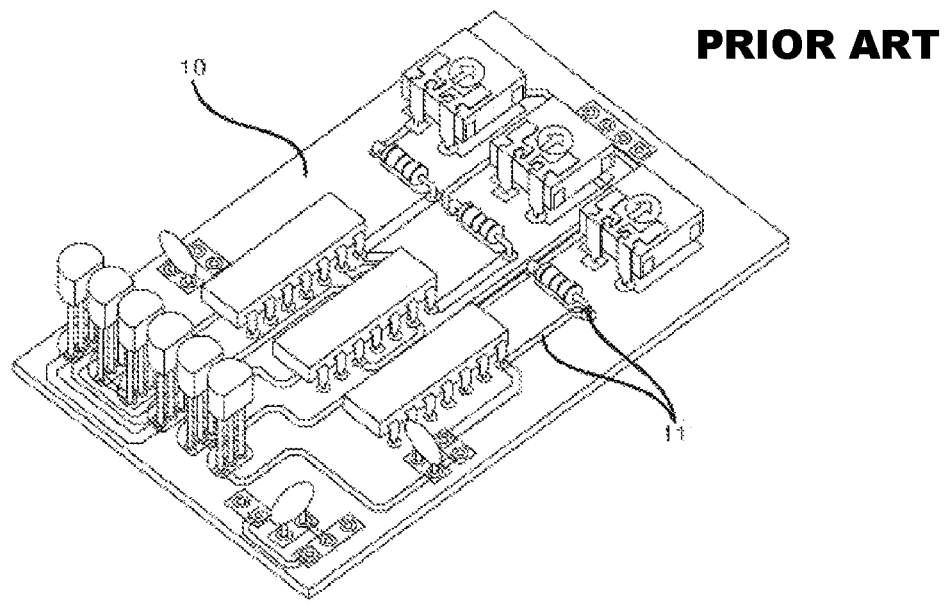
FIG. 1A is a diagram schematically illustrating a substrate in the related art.

The present invention will be described below in detail with reference to the accompanying drawings. Herein, the repeated description and the detailed description of publicly-known function and configuration that may make the gist of the present invention unnecessarily ambiguous will be omitted. Embodiments of the present invention are provided for more completely describing the present invention to those skilled in the art. Accordingly, shapes, sizes, and the like of elements in the drawings may be exaggerated for clearer explanation.

Throughout the specification, unless explicitly described to the contrary, a case where any part "includes" any component will be understood to imply the inclusion of stated components but not the exclusion of any other component.

In addition, the term "unit" disclosed in the specification means a unit that processes at least one function or operation, and the unit may be implemented by hardware or software or a combination of hardware and software.

Figure 1B:
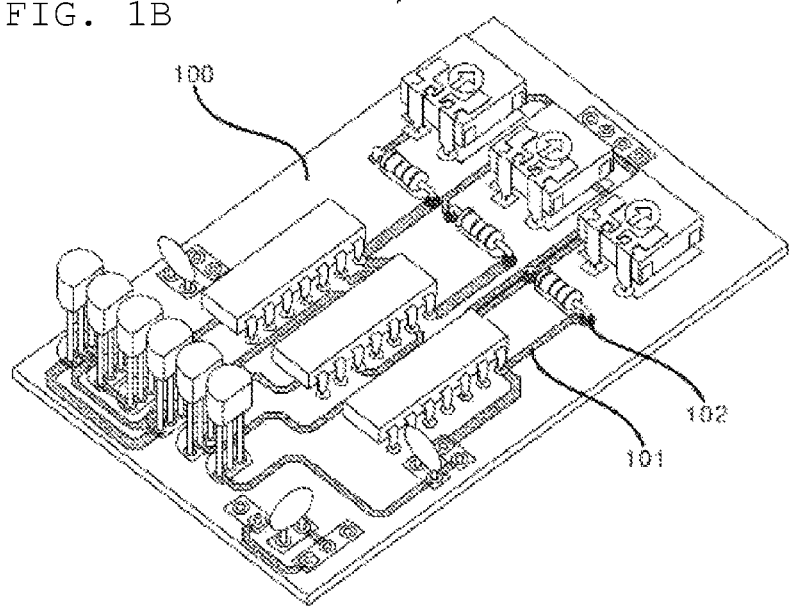
FIG. 1B is a diagram schematically illustrating a partially molded substrate according to an embodiment of the present invention.

FIG. 1B is a diagram schematically illustrating a partially molded substrate 100 according to an embodiment of the present invention.

However, the partially molded substrate 100 illustrated in FIG. 1B follows the embodiment and it should be noted that constituent elements and a shape thereof are not limited to those illustrated in FIG. 1B and as necessary, some constituent elements and shapes may be added, modified, or deleted.

First, referring to FIGS. 1A and 1B, the partially molded substrate 100 according to an embodiment of the present invention (e.g., as shown in FIG. 1B) may be implemented in a type in which a conductor 11 (for example, a pattern implemented by a semiconductor device and electronic ink, and the like, as shown in FIG. 1A) having conductivity of a substrate 10 in the related art is covered and molded with each of at least one of an insulator 101 and an insulation cap 102 having an insulating property.

In this case, the conductor 11 as an object having the conductivity, which is formed on one surface of the substrate 10 may include a pattern implemented by at least one of electronic ink and etching, and the like.

Further, it is noted that that the partially molded substrate 100 may be implemented as a printed circuit board (PCB) including a semiconductor device, but is not limited thereto.

Meanwhile, the insulator 101 according to an embodiment of the present invention covers and molds the conductor 11 and molds each of one or more conductors 11 to prevent voltage from being applied from any one conductor 11 among one or more conductors 11 to another conductor 11.

Herein, the thickness of the insulator 101 covering the conductor 11 may be controlled by a partial molding apparatus 200 described below.

In addition, the insulator 101 may be implemented as an insulating material including silicon, insulating rubber, and the like, but is not limited thereto.

In addition, when a liquid-state insulation material is filled and applied in the partial molding apparatus 200 to be described below, the insulator 101 may be formed by solidifying the applied liquid-state insulation material, but the present invention is not limited thereto.

For example, the insulator 101 is applied to the top of the conductor 11 by a molding unit 220 to be described below and solidified to cover and mold the conductor 11.

Meanwhile, a part which may cause voltage interference of the protruding conductor 11 among one or more conductors 11 of the substrate 10 may be covered and molded with a cap-shaped insulation cap 102 formed by the insulator 101.

For example, when the protruding conductor 11 is covered with the insulation cap 102 and the insulator 101 is applied to the corresponding insulation cap 102, the corresponding insulation cap 102 is fixed by the solidified insulator 101 to effectively prevent the voltage from being applied from the protruding conductor 11 to another conductor 11.

Figure 2:
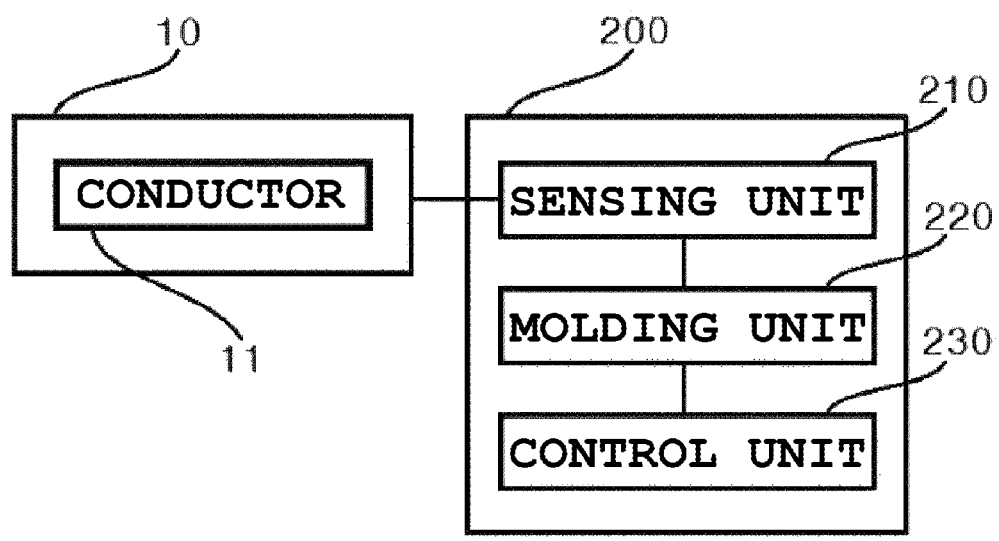
FIG. 2 is a diagram schematically illustrating a configuration of a partial molding apparatus according to an embodiment of the present invention.

FIG. 2 is a diagram schematically illustrating a configuration of a partial molding apparatus 200 according to an embodiment of the present invention.

However, the partial molding apparatus 200 illustrated in FIG. 2 follows the embodiment, and it should be noted that constituent elements thereof are not limited to the embodiment illustrated in FIG. 2 and as necessary, some constituent elements may be added, modified, or deleted.

Referring to FIG. 2, the partial molding apparatus 200 according to an embodiment of the present invention may be configured to include a sensing unit 210 and a molding unit 220. Further, the partial molding apparatus 200 may further include a control unit 230, such as a controller, as a constituent element thereof.

First, the sensing unit 210 may be a sensor (e.g., a voltage sensor) and may serve to sense the conductor 11 formed on one surface of the substrate 10.

Moreover, the sensing unit 210 may sense the voltage applied from the conductor 11.

However, herein, it is noted that the present invention is not limited to a case where the sensing unit 210 senses the conductor 11.

For example, the sensing unit 210 may sense at least one of the electronic ink, the etching, and the insulation material, if necessary.

Next, the molding unit 220 may be a molding machine, such as a potting or encapsulation molding device, and may serve to cover and mold the conductor 11 sensed by the sensing unit 210 with the insulator 101.

Meanwhile, when the conductor 11 of the substrate 10 protrudes, the molding unit 220 may effectively prevent the part which may cause the voltage interference of the protruding conductor 11 from being exposed by covering the protruding conductor 11 with the insulation cap 102 formed by the insulator 101 and fixing the insulation cap 102 by applying the insulator 101 to the insulation cap 102.

Further, the molding unit 220 may adjust the thickness of the insulator 101 that molds the conductor 11 based on a molding thickness of the insulator 101 set from the control unit 230.

For example, when a basic thickness of the insulator 101 is 1 mm and the molding thickness of the insulator 101 set by the control unit 230 is 2 mm, the molding unit 220 covers the conductor 11 with the insulator 101 twice to mold the conductor 11 with the insulator 101 having the thickness of 2 mm set by the control unit 230.

Further, the molding unit 220 may selectively mold only the conductor 11 positioned at a specific location of the substrate 10 based on a molding location of the insulator 101 set by the control unit 230.

In this case, selective molding of only the conductor 11 positioned at the specific location in the molding unit 220 may be achieved by molding the conductor 11 sensed by the sensing unit 210 by the molding unit 220 when only the conductor 11 positioned at the corresponding location among one or more conductors 11 on the substrate 10 is sensed by sensing only the specific location set by the control unit 230 by the sensing unit 210, but the present invention is not limited thereto.

Moreover, when a user excludes the molding of the conductor 11 to which voltage equal to or lower than specific voltage is applied through the control unit 230, the molding unit 220 may mold only the conductor 11 to which voltage equal to or higher than specific voltage sensed by the sensing unit 210 is applied.

For example, molding only the conductor 11 to which the voltage equal to or higher than the specific voltage is applied in the molding unit 220 may be achieved by excluding the conductor 11 to which the voltage equal to or lower than the specific voltage is applied among one or more conductors 11 sensed by the sensing unit 210 from a sensing target and molding the conductor 11 sensed by the sensing unit 210 in the molding unit 220 when the control unit 230 sets molding of the conductor 11 to which the voltage equal to or lower than the specific voltage is applied to be excluded, but the present invention is not limited thereto.

Next, the control unit 230 may serve to control at least one of the sensing unit 210 and the molding unit 220 based on an external input.

Herein, the external input may mean that a specific value is input by one or more of a user terminal (not illustrated) including a smart phone, a tablet, and a remote controller and input devices including a switch, and the like, but is not limited thereto.

Meanwhile, the control unit 230 may receive an input of at least one setting of setting of the molding thickness of the insulator 101 that molds the conductor 11 through the external input, setting of a sensing location on the substrate 10, and setting of molding exclusion of conductor 11 to which the voltage equal to or lower than the specific voltage is applied.

Further, by controlling at least one of the sensing unit 210 and the molding unit 220 based on the corresponding input, it is possible to control the molding and molding thickness of the conductor 11 on the substrate 10 according to the setting inputted through the external input.

Figure 3:
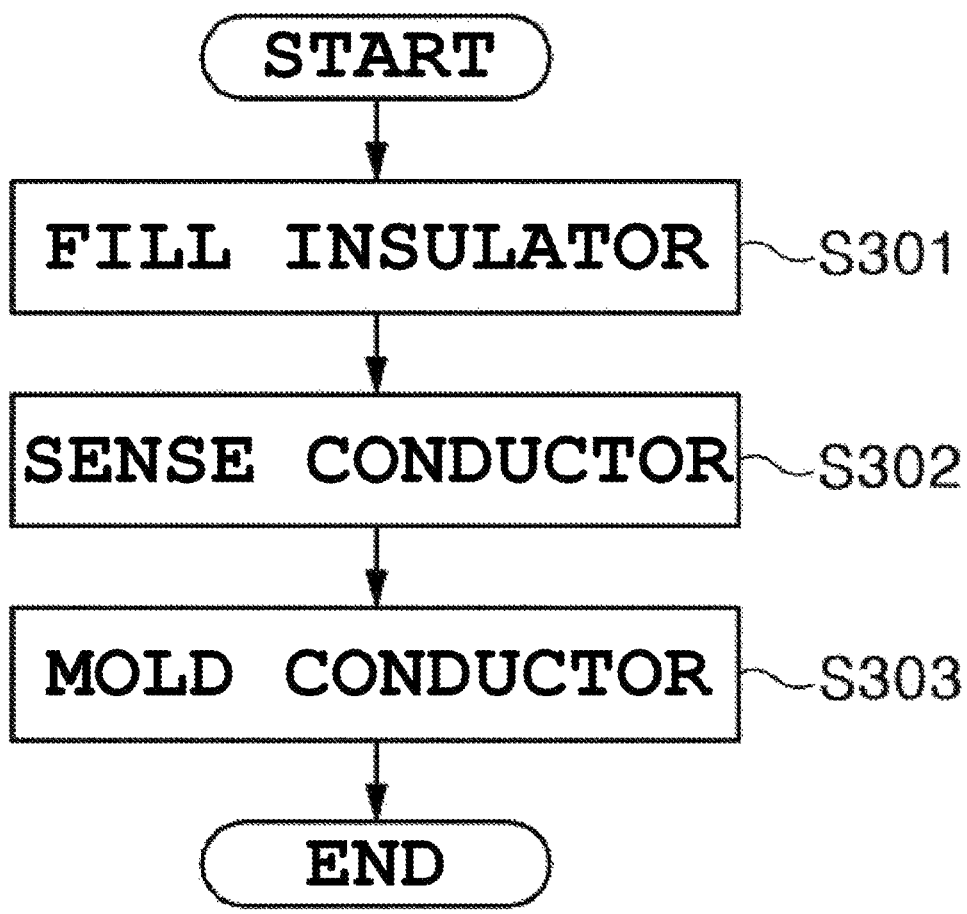
FIG. 3 is a diagram schematically illustrating a partial molding process of the partial molding apparatus according to an embodiment of the present invention.

FIG. 3 is a diagram schematically illustrating a partial molding process using the partial molding apparatus 200 according to an embodiment of the present invention.

However, the partial molding method illustrated in FIG. 3 follows the embodiment and it should be noted that the process thereof is not limited to the embodiment illustrated in FIG. 3 and as necessary, some processes may be added, modified, or deleted.

Referring to FIG. 3, the partial molding process of the partial molding method according to an embodiment of the present invention will be schematically described. First, the insulator 101 is filled in the partial molding apparatus 200 (S301).

In this case, filling the insulator 101 may mean filling an insulating material such as silicon in a liquid state before solidification, but is not limited thereto.

Next, the sensing unit 210 senses one or more conductors 11 formed on the substrate 10 (S302).

Herein, the sensing unit 210 may separately sense the conductor 11, such as a pattern formed by at least one of the electronic ink and the etching and the conductor 11 such as the protruding semiconductor device.

Meanwhile, when the conductor 11 is detected from the sensing unit 210, at least one conductor 11 which is sensed is covered and molded with the insulator 101 by the molding unit 220 (step S303).

In this case, when the conductor 11 sensed by the sensing unit 210 is the conductor 11 such as the pattern formed by at least one of the electronic ink and the etching, the molding unit 220 applies and solidifies the insulator 101 to the top of the conductor 11 to mold the corresponding conductor 11.

Further, when the conductor 11 sensed by the sensing unit 210 is the conductor 11 such as the protruding semiconductor device, the molding unit 220 may effectively prevent the part which may cause the voltage interference of the conductor 11 from being exposed by covering the conductor 11 with the insulation cap 102 formed by solidifying the insulator 101 and fixing the insulation cap 102 by applying the insulator 101 to the insulation cap 102.

Moreover, when the molding thickness of the insulator 101 is set by the control unit 230, the molding unit 220 may adjust the molding thickness of the insulator 101 that covers the conductor 11 by adjusting the number of molding times of the conductor 11 based on the corresponding setting.

Besides, when the molding location of the insulator 101 is set by the control unit 230, the molding unit 220 may mold only the conductor 11 positioned at a specific location of the substrate 10 based on the corresponding setting.

Further, when the control unit 230 sets the molding of the conductor 11 to which the voltage equal to or lower than the specific voltage is applied to be excluded, the molding unit 220 may selectively mold the conductor 11 to which the voltage equal to or higher than the specific voltage is applied among one or more conductors 11 on the substrate 10 based on the corresponding setting.

In this case, selectively molding the conductor 11 to which the voltage equal to or higher than the specific voltage is applied may be achieved by sensing only the conductor 11 to which the voltage equal to or higher than the specific voltage is applied by the sensing unit 210 and molding the conductor 11 sensed by the sensing unit 210 by the molding unit 220 when the control unit 230 sets the molding of the conductor 11 to which the voltage equal to or lower than specific voltage is applied to be excluded, but is not limited thereto.

Meanwhile, it is noted that filling the insulator 101 into the partial molding apparatus 200, sensing the conductor 11 by the sensing unit 210, and molding the conductor 11 by the molding unit 220 are not pre and post steps.

In addition, it is noted that at least one step of filling the insulator 101 into the partial molding apparatus 200, sensing the conductor 11 by the sensing unit 210, and molding the conductor 11 by the molding unit 220 may be added, changed, or deleted as necessary.

For example, when the user personally designs the substrate 10 including the conductor 11, the user may mold each conductor 11 by using the molding unit 220 in the process of installing the conductor 11 on the substrate 10.

Further, when the user personally designs the substrate 10 including the conductor 11, the user recognizes the location of the conductor 11 on the substrate 10, and as a result, each of one or more conductors 11 to be molded may be molded by using the molding unit 220 without sensing the conductor 11 by the sensing unit 210.

Hereinabove, a specific embodiment of the present invention has been illustrated and described, but the technical spirit of the present invention is not limited to the accompanying drawings and the described contents and it is apparent to those skilled in the art that various modifications of the present invention can be made within the scope without departing from the spirit of the present invention and it will be understood that the modifications are included in the claims of the present invention without departing from the spirit of the present invention.

The invention claimed is:

1. A partial molding apparatus for partially molding a substrate including one or more conductors formed on one surface of the substrate, the partial molding apparatus comprising:
   a sensing unit configured to sense a property indicative of the one or more conductors;
   a control unit configured to receive the sensed property from the sensing unit and determine a respective location of each of the one or more conductors on the surface of the substrate based on the sensed property; and
   a molding unit communicatively coupled to the control unit and configured to cover and mold each of one or more conductors sensed by the sensing unit with an insulator based on the determined respective locations of each of the one or more conductors communicated by the control unit to the molding unit.

2. The partial molding apparatus of claim 1, wherein when a conductor protrudes from the surface of the substrate, the molding unit is configured to cover and mold the protruding conductor with an insulation cap formed by the insulator.

3. The partial molding apparatus of claim 1, wherein the molding unit is configured to cover and mold each of the one or more conductors with the insulator at a set molding thickness.

4. The partial molding apparatus of claim 1, wherein the molding unit is configured to selectively cover and mold conductors positioned within a set molding region with the insulator.

5. The partial molding apparatus of claim 1, wherein the sensing unit is configured to sense a voltage of each of the one or more conductors, and the molding unit is configured to selectively cover and mold conductors having a sensed voltage equal to or higher than a predetermined voltage with the insulator.

6. The partial molding apparatus of claim 3, wherein the control unit is further configured to control the set molding thickness of the insulator, and wherein the molding unit is configured to cover and mold each of the one or more conductors with the insulator at the set molding thickness according to the control unit.

7. The partial molding apparatus of claim 6, wherein the molding unit is configured to mold each of one or more conductors with the insulator in increments of a predetermined thickness until a thickness of the insulator equals the molding thickness set by the control unit.

8. The partial molding apparatus of claim 6, wherein the control unit is configured to set the set molding thickness according to an external input.

9. The partial molding apparatus of claim 1, wherein the molding unit is further configured to fix the insulation cap in place by applying the insulator to the insulation cap.

* * * * *